United States Patent [19]

Klapproth et al.

[11] Patent Number: 5,590,354

[45] Date of Patent: Dec. 31, 1996

[54] MICROCONTROLLER PROVIDED WITH HARDWARE FOR SUPPORTING DEBUGGING AS BASED ON BOUNDARY SCAN STANDARD-TYPE EXTENSIONS

[75] Inventors: Peter Klapproth; Frederik Zandveld; Jacobus M. Bakker; Gerardus C. Van Loo, all of Eindhoven, Netherlands

[73] Assignee: U.S. Philips Corporation, New York, N.Y.

[21] Appl. No.: 281,964

[22] Filed: Jul. 28, 1994

[30] Foreign Application Priority Data

Jul. 28, 1993 [EP] European Pat. Off. .............. 93202228

[51] Int. Cl.$^6$ ................................................. G06F 11/00
[52] U.S. Cl. .................. 395/800; 395/183.06; 371/22.3; 364/232.8; 364/267.91; 364/DIG. 1
[58] Field of Search ....................... 395/800, 500, 395/250, 182.08, 182.19, 183.01, 183.04, 183.06, 183.11, 183.13; 371/3, 21.3, 21.6, 22.3, 23, 29.1

[56] References Cited

U.S. PATENT DOCUMENTS

| | | | |
|---|---|---|---|
| 4,788,683 | 11/1988 | Hester et al. ...................... | 395/183.06 |
| 5,058,114 | 10/1991 | Kuboki et al. ...................... | 395/183.14 |
| 5,355,369 | 10/1994 | Greenbergerl et al. ................ | 371/22.3 |
| 5,377,198 | 12/1994 | Simpson et al. ........................ | 371/22.3 |
| 5,381,420 | 1/1995 | Henry ...................................... | 371/22.3 |
| 5,400,345 | 3/1995 | Ryan, Jr. .................................. | 371/22.3 |
| 5,428,623 | 6/1995 | Rahman et al. ........................ | 371/22.3 |
| 5,444,859 | 8/1995 | Baker et al. ........................ | 395/182.18 |
| 5,515,382 | 5/1996 | Lassorie .................................. | 371/22.3 |

OTHER PUBLICATIONS

"DSD Development Tools Engage Mainstream Designers" K. Marrin, Computer Design, vol. 32, No. 1, Jan. 1993.

*Primary Examiner*—Alpesh M. Shah
*Attorney, Agent, or Firm*—Laurie E. Gathman

[57] ABSTRACT

A microprocessor includes a processor element, a memory interface element, an IO interface element, a debug support element and an internal bus interconnecting all above elements. For easy debugging, it also includes attached to the internal bus a registered boundary scan standard (JTAG) interface that accesses one or more scan chains inside the microprocessor, and is arranged for controlling DMA-type exchanges via the internal bus with other elements connected to this bus.

10 Claims, 3 Drawing Sheets

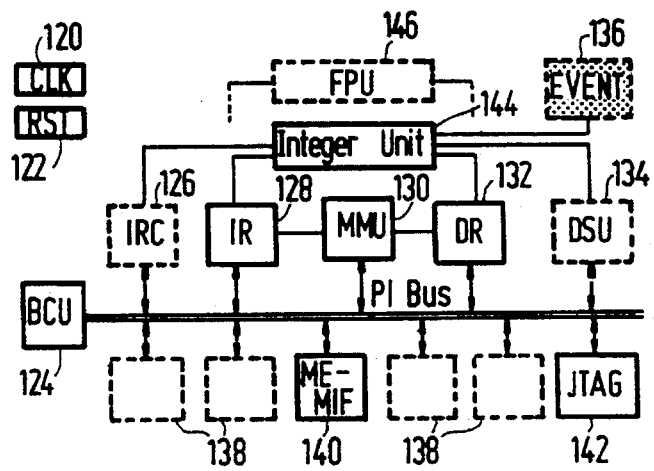
FIG.4
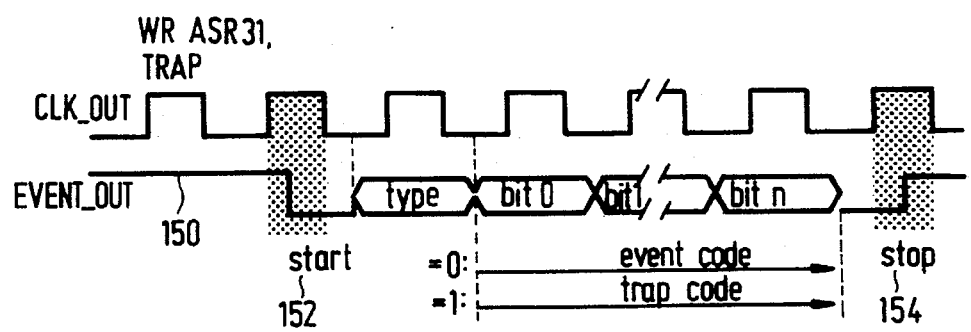
FIG.5A
FIG.5B

MICROCONTROLLER PROVIDED WITH HARDWARE FOR SUPPORTING DEBUGGING AS BASED ON BOUNDARY SCAN STANDARD-TYPE EXTENSIONS

FIELD OF THE INVENTION

The invention relates to a microprocessor comprising a processor element, a memory interface element, an IO interface element, a debug support element and an internal bus interconnecting all above elements. Such microprocessors have been in general use for executing computer programs in an environment of calculating, controlling, signal processing and other. A program must be checked for errors or other malfunctioning during a debugging operation. Often, this is done by successively recording all addresses transferred via the microprocessor bus. This recording can be done, either by monitoring the internal bus directly, or by temporarily logging such addresses for subsequent outputting and checking. Often, such procedures either take much time in a step-by-step operation, or alternatively, require extensive external accessibility through a large amount of additional microprocessor pins. Both approaches are expensive. Moreover, it is difficult on an organizational level to execute the monitoring in real time in view of the enormous amount of data produced.

SUMMARY TO THE INVENTION

In consequence, amongst other things it is an object of the present invention to diminish the above costly requirements and improve the functionality through the usage of the so-called boundary scan standard facilities that currently are being introduced into a large traction of complex integrated circuits. Now, according to one of its aspects, the invention is characterized in that by comprising attached to said internal bus a registered boundary scan standard (JTAG) interface element that accesses one or more scan chains inside said microprocessor, and furthermore is arranged for controlling DMA-type exchanges via said internal bus with other elements connected to said internal bus boundary scan standard or JTAG Standard has been described extensively in IEEE Standard 1149.1, and in particular in GB Patent Application 2,195,185 and corresponding U.S. application Ser. No. 07/90489 to the present assignee. Originally, the Standard was conceived to facilitate board level testing, but it offers many advantages on the level of a single integrated circuit as well, and in consequence will hereinafter be called JTAG standard for brevity. According to the Standard the minimum test interface has one serial data input pin, one serial data output pin, a test clock pin, and a test control pin. An additional reset pin is optional. According to the Standard, under external synchronization, first a control pattern is loaded into a circuit, which pattern may be used as well for addressing the circuit in question, and so provides test initialization. According to the Standard, next the test pattern is loaded in an input register. After a brief interval of normal operation of the circuit, the test result is outputted from an output register, which may be overlaid with entering the next test pattern. Various additional features have been proposed. A particular feature of the Standard is the one bit bypass connection between serial input and serial output. For executing the debugging, one or more data registers are interconnected between the on-chip bus and the serial JTAG test interface. In this way, only the four or five additional pins proper to the JTAG interface must be added to the normal circuit functionality. By itself, the Direct Memory Access or DMA feature is a standard functionality in a microprocessor environment.

According to the invention, the JTAG interface can now access various scan chains that consist of serialized flipflops. Moreover, via a number of appropriately arranged ones of these scan chains the JTAG interface can execute direct memory access DMA to all on-chip functional units that are connectable as slaves to the on-chip bus. For example, JTAG may access RAM memory for effecting LOAD, CHANGE, INSPECT, BOOT, and other operations. Likewise, it may access ROM memory. Likewise, it may access breakpoint registers for effecting SET and INSPECT operations. Likewise, it may access an external event trace buffer memory for recording instructions. Likewise, it may access various other elements, such as counters, timers, FIFO storage, control registers, and other elements, according to the needs of a designer person. It is noted that all of these elements can also be reached by the software, so that accessing these elements by the JTAG interface is an excellent mechanism for allowing debugging, tracing, and other test support mechanisms. As a consequence of the above, the processor element need not halt its operation during communication between the debug support element and the various scan chains. Advantageously, said JTAG interface element allows downloading informations communicated by an external station. This downloading process is based on the peek and poke primitives, known from their widespread usage in various computer languages, for so accessing the memory and filling it quickly with new information.

Advantageously, the debug support element is externally to the internal bus directly connected to the processor element. This close interconnection allows for easy scrutinizing, without in doing so necessitating bus cycle time: in this way, a trace buffer located in the debug support element can be filled directly from the processor element.

Advantageously, the JTAG interface directly accesses one or more breakpoint registers. This allows to load these registers at run time for subsequent evaluation while maintaining standard run speed.

Advantageously, the debug support element contains an internal event trace buffer memory for accommodating a restricted set of contents of non-sequential addresses as generated by the processing element and allowing at least one of the following storage modes for a limited time operation of said microprocessor: storing of all non-sequential addresses, and/or storing of all call, jump, and trap addresses, or any appropriate selection or part of these. This represents a broad spectrum of debug operations that need only little hardware, inasmuch as only an appropriate fraction of the addresses, and in particular the relatively most critical ones of these are retained.

Further advantageous aspects of the invention are recited in dependent Claims. The invention in particular has been considered as an advantageous functionality extension for SPARC microprocessors, although its application is not limited to this particular type.

BRIEF DESCRIPTION OF THE DRAWINGS

These and other aspects and advantages will be discussed more in detail with reference to the disclosure of preferred embodiments hereinafter, and in particular in and by the appended Figures that show:

FIG. 4 an embodiment of serial event output facilities;

FIGS. 5A and 5B an embodiment of a basic serial out protocol.

DETAILED DESCRIPTION OF PREFERRED EMBODIMENTS

Figure 1:
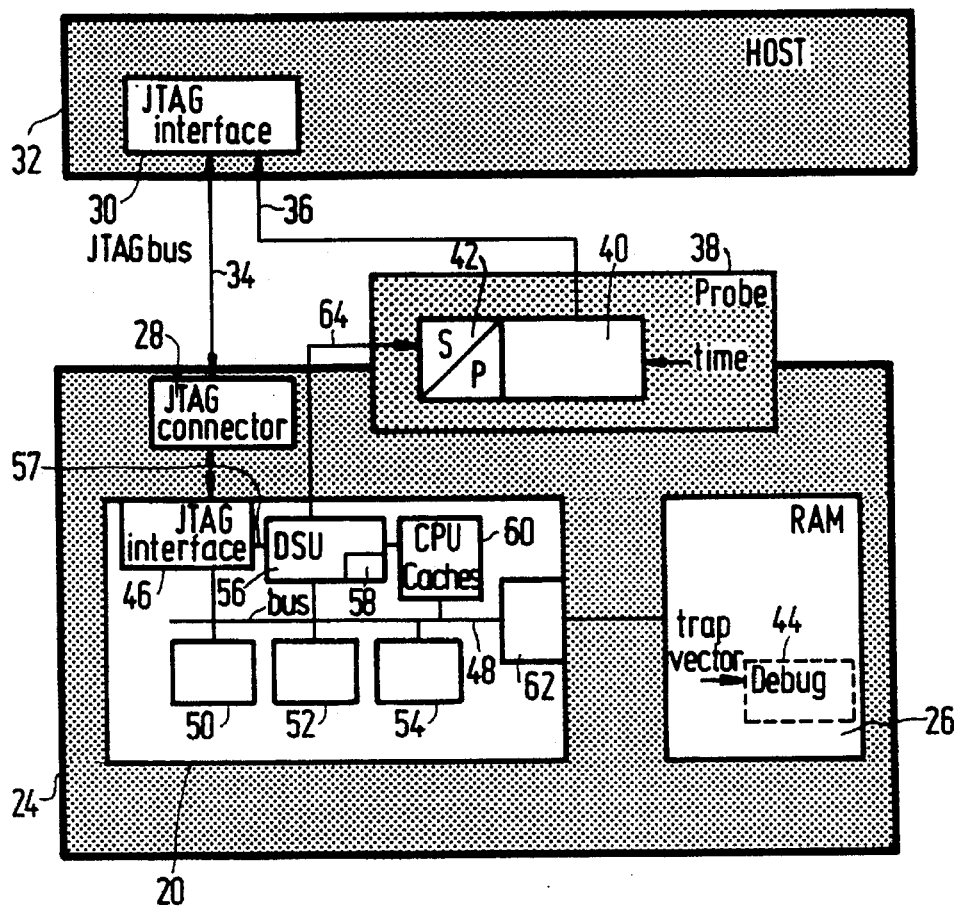
FIG. 1 a microcontroller with hardware for event tracing.

FIG. 1 shows a debugging environment with a microcontroller or microprocessor provided with the basic hardware for event tracing. Microcontroller 20 sits on target board 24 together with its system RAM memory 26. The microcontroller 20 is provided with a boundary scan or JTAG debug interface 46 that via JTAG board connector 28 and interconnection 34 is connected to host workstation 32 that itself has a JTAG interface card 30. The latter can interface to a plurality of JTAG interconnections such as 36. Microcontroller 20 has an on-chip system bus 48 that interconnects various subsystems, such as JTAG debug interface 46, a debug support unit 56 with an on-chip trace memory 58, processing element with caches 60, memory interface 62, and various further unnamed subsystems 50–54, such as an IO interface element. Via interconnection 64, debug support unit 56 is connected to a test probe or logic analyzer that has a serial-to-parallel converter 42, an event trace memory 40, and receives a time stamp from a source not shown. The event trace memory 40 via interconnection 36 that may be JTAG based is connected to host work station 32. System RAM 26 contains a debug section 44 that is addressed by a symbolically indicated debug trap vector. Finally, there is a direct interconnection 57 between the debug support unit 56 and JTAG interface 46.

Serial output 64 has a one-bit-wide dam path plus CLK-OUT and provides real-time information on the occurrence of software or hardware triggered events, such as: it shows the general flow of software, identifies task latency in a multitasking system, identifies software sections that are of special interest for debugging, and triggers an external logic analyzer hardware under software control. According to the invention, the event trace facility does not need to provide trace reconstruction with instruction address granularity but it gives a good overview on the time behaviour of embedded real-time software. It is useful for timing analysis and performance measurement.

The serial event information is a 0..16 bit dam packet plus start and stop condition signals. Together with a time stamp, the parallelized data packet is stored in the event trace memory 40, that has a cycling address counter. The CLK-OUT signal not separately shown provides synchronization, and may be a subharmonic of the microcontroller clock. Events may without limitation be triggered by three causes: execution of a special non-privileged instruction, entry of traps and/or interrupts, and by a matchpoint occurring at match by a debug condition compare register. In the realization with the SPARC microcontroller the yet unused and unprivileged instruction WR ASR31 is used as event trigger; its opcode field accommodates a 13 bit immediate operand. Its value is defined either manually during software development, or automatically at compilation time via a prologue/epilogue mechanism for every individual subroutine. Execution of the WR ASR31 instruction occupies the IU pipeline for only one clock cycle. In many cases this is so little that the debug instructions need not be removed from the final code. Another hardware platform would need a similar feature.

The above explains the double usage of the JTAG interface for debugging. Two optional pins may be added for enhanced functionality. The double usage of the interface needs only little extra on-chip hardware area for implementing basic features, but may be expanded in a straightforward way. Basic features are the following:

JTAG provides straightforward host-target communication

Provision of software breakpoints

Hardware single-step

External break request and reset control from the host.

A few useful extensions are:

Hardware breakpoints on instruction address, data address, data store value and range On-chip memory for instruction address trace at various different levels of trace granularity Serial real-time event trace output facility including event identification.

The JTAG debug interface block at the target processor side provides the following internal data registers for debug communication purposes that can be read and written bit-sequentially by the host system: DMA_ADDR, DMA_DATA, DMA_CONTROL_STATUS. By means of these registers, the interface block provides a bridge functionality between the external JTAG bus and an on-chip system bus. Any memory-mapped slave-type device connected to the latter bus system can be accessed via the bridge from the host system. Thus the host is able to perform direct memory accesses (DMA) to any memory mapped resource of the target system. The DMA_ADDR register must be initialized with the target address before a DMA access. The DMA_DATA register must be initialized with write data before a write access can be initialized. After a DMA_READ access, the DMA_DATA register contains the read data. The DMA_CONTROL_STATUS register provides the following control functions:

select DMA access type (read/write, ASI-control space, byte-halfword-word selection) start the DMA access lock the system for exclusive JTAG usage of the DMA feature auto-incrementing of the DMA_ADDR register contents force a system RESET issue an external debug break or trap request handshake flags for host-target monitor communication protocol.

In this manner a cooperation between the communication protocol and the direct memory access facility has been realized. The registers have been well-defined and geographically clustered. The DMA is synchronized by a different clock TCK than the system clock and its register accessing can be executed even if the system clock is unavailable, such as in standby state. Also the test clock TCK may be much slower than the system clock; cf. FIG. 3, nos. 96, 98. These organizational aspects facilitate designing the control software, because all relevant information is now present inside the DMA scan chain.

The following status information is visible to the host system when reading the DMA_CONTROL_STATUS register:

DMA busy and handshake flags for bidirectional host⇌target monitor communication protocol break status and status flags indicating states such as processor error or power down.

If the JTAG interface is indeed provided with an independent TRSTN reset line, it is possible to reset the DMA registers while the target system is kept running. An even more interesting operating mode is keeping the processor in reset and initialize the JTAG facilities through loading appropriate registers. Now, the following exemplary subsystems can be accessed through JTAG DMA access:

- interface to an external memory that becomes JTAG-accessible
- IO interface that renders IO devices JTAG-accessible
- internal memory such as RAM, ROM, Cache and MMU Translation lookaside buffer TLB
- internal registers such as timers, counters, interrupt and application cell functions
- debug support registers, such as for break-point match and application cell functions.

All these subsystems are memory-mapped and can be accessed directly from the target system without processor intervention. The DMA controlled by the JTAG interface is an extremely straightforward vehicle. The processor element can even continue executing any ongoing program execution. Furthermore, because JTAG needs only brief accesses, the system bus remains largely available for other stations intending to be bus master. Finally, uploading and downloading between internal target system and external target system is fast: for example <5 secs for 1 MByte data at a 10 MHz test clock. Internal processor registers, such as the register file(s) or the Ancillary State Registers ASR that have been defined in the SPARC microcontroller cannot be directly accessed through JTAG, but only by monitor software. For this purpose, the host system can request a debug break via the JTAG DMA_CONTROL_STATUS REGISTER, thus forcing the processor to enter the monitor program. The data exchange between the monitor program that runs on the target system, and the host computer is performed via memory locations that are accessible via the JTAG DMA, and associated input and output buffers. The communication protocol has a handshake.

As shown in the debug configuration system of FIG. 1, the system RAM has a small section allocated for debug support. This section contains

- a debug trap handler program that provides a link to the monitor program
- either a full monitor program, or only those monitor command routines that may execute one command at a time
- buffers for communicating command+parameters and response between host and target monitor
- direct accessibility from the host via JTAG DMA.

These features have cost advantages in that no extra pins are needed, no dual port is necessary that should be accessible from both host and target processor, and no time-critical multiwire link is necessary from target processor to a remote debug RAM. During the debugging process no special firmware is required like a boot-PROM on the target board. Debug trap handlers and monitor program are downloaded via JTAG into system RAM before the target processor starts program execution.

An extra problem for real-time instruction tracing in RISC type processors is that in each clock cycle one or more instructions are fetched from an internal cache memory whose addresses are not visible at the chip boundary. To solve the problem a limited size on-chip trace memory of 32 entries has been provided that loads internal addresses and can be read by the host via the JTAG facilities. The small size of the trace memory necessitates scrupulous assigning of its capacity. Various trace modes are: load all addresses, load all non-linear addresses, that is those that are other than the simple increment-by-one, and load only addresses following call, trap or jump instructions. A further usage is to start loading upon reaching a preset breakpoint, and subsequently loading all addresses until the trace memory is full. Various combinations of the above are also useful.

The serial event output facility 64 is used for time stamping of the entries in the external trace memory 40. The event output provides information in real-time on the occurrence of software- or hardware-triggered events. Its main applications are to:

- show the general flow of software
- identifies interrupt latencies in a system
- identifies rusk activity in a multitasking system
- identifies software sections that may need special debugging
- triggers an external analyzer under software control.

A relatively small trace buffer, although not providing trace reconstruction with instruction address granularity, generally will give an excellent overview on the time behaviour of embedded real time software, which is useful for performance measurement and timing analysis. The required facilities are a serial parallel converter 42, a trace memory 40 of appropriate capacity, and a timestamp generator mechanism as indicated.

Figure 2:
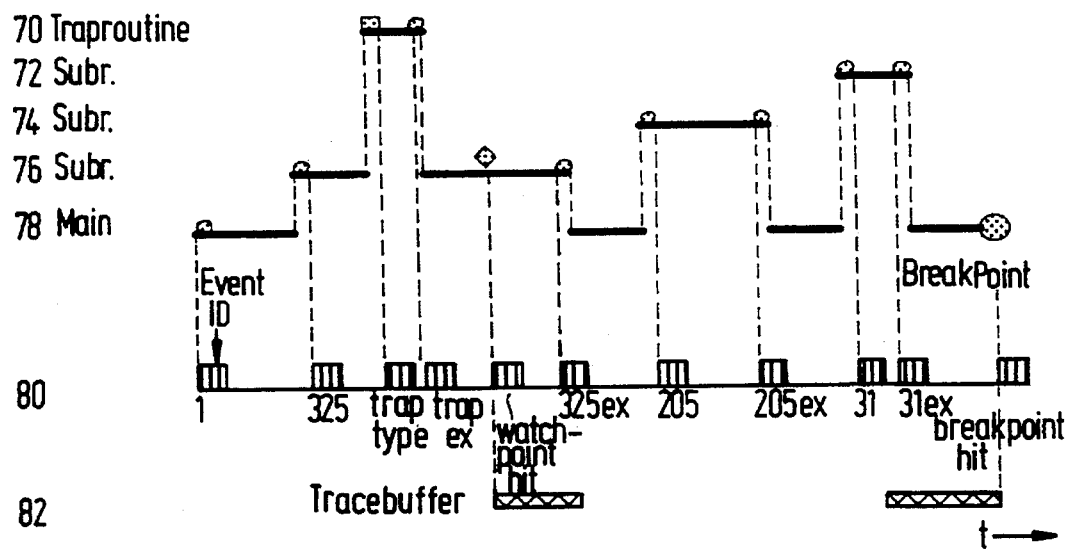
FIG. 2 a tracing example.

As shown in the example of FIG. 2, trigger instructions are preferably placed at strategic positions, such as trap exits, subroutine entries and exits, and jump table targets. In FIG. 2 time runs horizontally. The solid steps show machine activity that alternates between main program level 78, subroutine levels 72, 74, 76, and trap routine level 70. Trace 80 symbolizes the serial event output data through blocks. Here, these occur at start, at entrance and exit of all subroutines, at watchpoint hit (diamond at level 76) and finally at breakpoint hit (level 78). A WR ASR31 instruction is shown by a small circle and a trap is symbolized by a block. The span of coverage of the internal trace buffer is indicated at level 82. When using a watchpoint hit, the match occurred causes a debug trap to the processor, which then must execute a trap handler. Subsequently, it will wait for commands from the host. This is communicated to the host via a status register contained in the JTAG interface.

Figure 3:
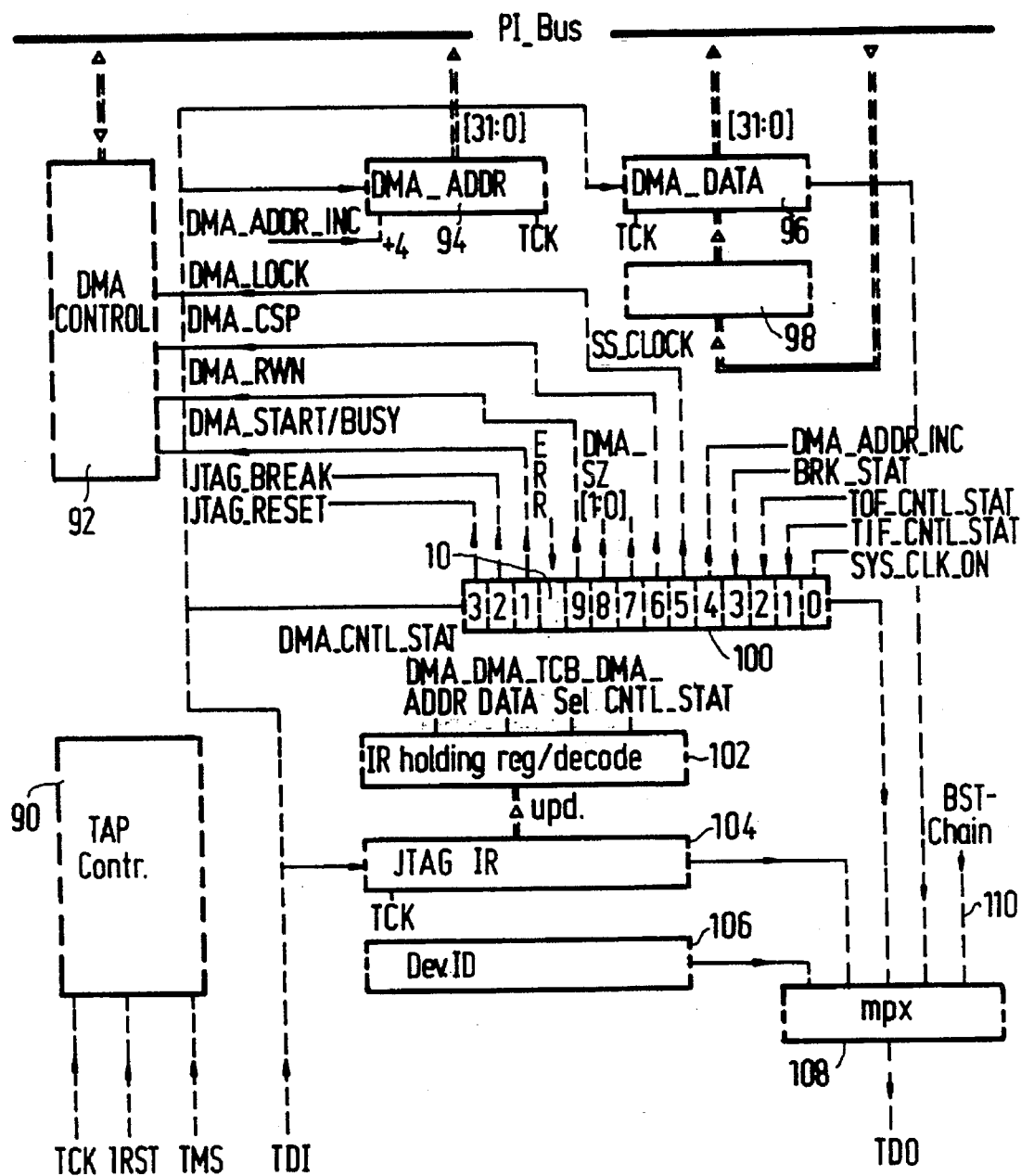
FIG. 3 a JTAG boundary scan block in the architecture.

FIG. 3 illustrates the JTAG boundary scan block inclusive of its various operating modes in the processor architecture. For brevity, the JTAG facilities are only recited without further detail. The five pins at bottom are test clock TCK, test reset TRST, test mode select TMS that controls the various modal transitions in TAP controller 90, test data in TDI, and test data out TDO. The port acts as a DMA master on the internal bus shown as a heavy line at the top; the port may access any slave connected to the bus, even while the processing element is executing. During arbitration, the port has highest priority. The DMA operation is initiated via the boundary scan external interface, such as by an external work station. The boundary scan facilities number a device ID register 106. Clocked instruction register 104 loads from TDI and accommodates five-bit instructions. The following instructions are used: Instruction ● Mnemonic ● Register length ● Function

| | | |
|---|---|---|
| 00000 | EXTEST | 32 Select boundary scan register |
| 00001 | IDCODE | 32 Chip identification code |
| 00010 | SAMPLE/PRELOAD | 32 Select boundary scan register |
| 01000 | MACRO | 1 Macro test mode, enables production test. |
| 10000 | DMA_ADDR | 32 DMA address register |

| | | |
|---|---|---|
| 10001 | DMA_DATA | 32 DMA data register |
| 10010 | DMA_CNTL_STAT | 14 DMA control/status register |
| 10011 | DMA_ALL | 78 all DMA registers in one |
| 11111 | BYPASS | 1 chain bypass mode |

In the above, the third column gives the applicable register length. For simplicity, the bypass itself has not been shown. In addition to the above, the Figure has DMA control elements and further output multiplexer 108 that feeds result data output line TDO.

The instruction register is implemented in two parts: a parallel load register 102, and a shift register 104. While a new instruction is received via input TDI, the parallel register retains the value of the preceding instruction. When TAP controller 90 subsequently enters the Update_IR state, the contents of the shift register are transferred in parallel to the parallel load register, and become the new instruction. For example, the instruction DMA_ADDR will load 32 bits from TDI into the JTAG data register 'DMA_ADDR'. At DR-Update, this data is available as device address on the internal bus from register 94. Register 94 has a count input with a +4 increment as shown and an effective count range of six bits; the two least significant bits are not used. It is controlled by signal DMA_ADDR_INC from DMA control register 100: this allows up to sixty-four consecutive addresses to be DMA-ed without needing to reload DMA_ADDR. DMA dam register 96 is used to store data communicated to or from the slave thus addressed. Write dam must be loaded before DMA_Start request is given. Read data is captured under synchronization from system clock in register 98. At Capture_DR this data is transferred from register 98 to register 96 and serialed out via multiplexer 108 and TDO.

DMA_CNTL_STAT register 100 has 14 defined bits, as follows:

[0]: SYS_CLK_ON indicates the status of tile system clock. When system clock is active, this bit=1.

[1]: TOF_CONTL_STAT gives the control and status of the Test Output Full flag in the DSU DSTAT control register. The TOF flag will not be cleared if this bit is set, but the DMA access is terminated by a bus error.

[2]: TIF_CNTL_STAT gives tile control and status of the Test Input Full flag in the DSU DSTAT control register. The TIF flag will not be set if this bit is set, but the DMA access is terminated by a bus access. Read: the status of the TIF flag in DSU DSTA control; write: 1=set TIF bit in DSU STAT control register after DMA is finished, 0=no change. The two bits TIF_CONTL_STAT and TOF_CONTL_STAT together represent a handshake for the communication protocol.

[3]: BRK_STAT read-only: 1=IU is in break state, 0=IU is not in break state.

[4]: DMA_ADDR_INC write only: 1=add 4 to DMA_ADDR data register before starting the DMA, 0=no change. The addition is modulo-256. The DMA_ADDR is incremented each time an update of the DMA_CNTL_STAT is done with the DMA_ADDR_INC bit set 1. The two least significant bits (1–0) will not change.

[5]: DSU_CNTL_STAT: DMA_LOCK. Lock the PI (processor-internal) core bus if a DMA is started. This can be used to lock the PI core bus if more than one atomical DMA access is required. The last DMA access must have DMA_LOCK=0 to unlock the PI core bus. Write-only:1= lock PI core bus; 0=no lock.

[6]: DSU_CNTL_STAT: DMA_CSP. Do a control space DMA access. This bit allows the JTAG/Test module to read/write ASI mapped resources on the PI core bus. Address bits DMA_ADDR [31:24] indicate the control space (=ASI) identifier. The low 24bits (DMA_ADDR [24:0]) form the address within the control space. Write only: 1=control space DMA, 0=no control space DMA.

[8:7]: DMA_CNTL_STAT: DMA_SZ [1:0]. The two bits indicate the data size of the DMA: write only: 00=byte, 01=half word, 10=word, 11=illegal.

[9]: DMA_CNTL_STAT: DMA_RWN. The direction of the DMA access. Atomic read/writes can be done by setting the DMA_CNTL_STAT [5] bit (lock the PI core bus after the read). Write only: 1=Read access, 0=Write access.

[10]: DMA_CNTL_STAT: DMA_ERR. This bit indicates that a bus error has occurred during the DMA. This bit is only valid if the DMA has been finished (DMA_START_BUSY=0). Read only: 1=no error, 0=no error.

[11]: DMA_CNTL_STAT: DMA_START_BUSY. This bit controls the start of the DMA and signals if the DMA has been finished. The DMA_START_BUSY has to be written 0 to allow the read value to go to 0 (=DMA finished). Setting DMA_START_BUSY will clear this bit. Read: 1=DMA busy, 0=DMA finished or not started. Write: 1=start DMA, 0=no change. The basic loop for starting DMA is:

write DMA_CNTL_BUSY=1 wait till DMA_CNTL_BUSY=1 (DMA access is started)

write DMA_CNTL_BUSY=0 wait till DMA_CNTL_BUSY=0 (DMA access is finished)

The read DMA_CNTL_BUSY value will not change from 1 to 0 before a write 0 to DMA_CNTL_BUSY has been effected when the read DMA_CNTL_BUSY=1. This is to ensure that the software has detected a '1' (DMA started) before subsequently the 'DMA finished' is signalled.

[12]: DMA_CNTL_START: JTAG_BREAK. Write only: 1=generate break trap, 0=no break trap. With this bit a break trap can be generated in the IU.

[13]: DMA_CNTL_STAT: JTAG_RESET. Write only 1=reset, 0=no reset. With this bit the circuit can be reset via the JTAG interface.

Some example values for the DMA_CNTL_STAT register contents:

00 1001 0001 0100: Start DMA write, size is word, no control space, no bus lock, increment DMA_ADDR before DMA is started and set TIF flag in DSU_STAT control register if DMA is ready.

00 1010 0110 0010: Start DMA read in control space, size=byte, lock the bus for further DMA transfers, clear TOF flag when DMA is finished.

10 0000 0000 0000: RESET the circuit.

01 0000 0000 0000: generate a break trap in the integer unit. DMA_CNTL_STAT[3] can be used to check if the break trap has indeed been taken.

The PI core bus has been shown by the heavy line at the top of the Figure. Further subsystems of the arrangement are JTAG controller module 90, called TAP controller with test clock, test reset, and test mode inputs, DMA control module 92, registers DMA_ADDR 94 and DMA_DATA 96, clock register SS_CLOCK 98, register DMA_CNTL_STAT 100, Information holding register and decode 102, JTAG information register 104, device ID register 106, and output multiplexer 108. One of the inputs to the latter is JTAG chain input 108. Various subsystems as shown can be loaded form the serial data in chain TDI. For brevity, the hardware particular to the JTAG standard interface has only been sketched in a summary way.

FIG. 4 shows an example of hardware facilities for serial event output. In the setup, the central PI Bus is attached to various subsystems, and surrounded by a few non-connected subsystems, these are as follows:

the processor clock 120 the central reset facility 122 the bus control unit 124 interrupt controller 126 instruction requester (cache), symbolized 128 memory management facility 130 data requester (cache), symbolized 132 debug support unit 134 serial event output facility 136 various unnamed further subsystems 138 memory interface element 140

JTAG boundary scan facilities 142 including TAP controller integer processing unit 144 optional floating point unit 146.

Most of the above subsystems may be of standard functionality. For simplicity, the direct interconnection between the debug support unit and the JTAG interface (item 57 in FIG. 1) has not been shown here. It is used to directly and quickly communicate breakpoint hit information into the DMA_CNTL_STAT register. Via polling via the PI bus this would have taken much longer but now it can be effected by means of the BRK_STAT functionality discussed with respect to FIG. 3.

FIGS. 5A and 5B show an example of a basic serial out protocol that may occur on line 64 in FIG. 1. The protocol leans somewhat on the well known I2C protocol described in EP Patent application 51332. During standard data transfer, transitions on the single data line (lower trace) may occur when the clock (upper trace) is low. If the clock is high, no such transition is allowed. Start condition 152 and stop condition 154 violate these prescriptions through data transition when the data is high, and so realize their intended operations. Outside of the data transfer interval, the clock trace may continue. In the present example the serial event outputting has been caused by the execution of the brief instruction WR ASR31. Just as in I2C, the event identifications are coded in a range from 0 to $2^{13}$ by the number of 13 bits. For enhancing transfer speed, leading zeroes are suppressed. In this way, also a flexible packet length is realized. When no serial event information is output, the EVENT_OUT line is constantly held at '1' level. During transmission, the first bit indicates the packet type, and is followed by data.

The information received at the probe 38 in FIG. 1 is parallelized and stored together with a time stamp taken at the start condition in the external event trace memory. The CLKOUT signal from the target processor is required for synchronization purposes. Bits on the serial signal output are synchronous to CLKOUT normally running at system clock speed. In case of very high system clock frequency it may be required to perform the serial output at a subharmonic of the system clock. Facilities on the target board allow easy connection to a probe or logic state analyzer.

Recapitulating, the JTAG facilities are enhanced by adding DMA registers for communicating between JTAG and the on-chip system bus. In particular DMA may function as bus master. Seen from the debug support unit DSU, an instruction trace memory has been added on-chip, and is provided with a serial event output. Finally, an external event trace buffer has been added that is driven by a serial event output.

We claim:

1. A microprocessor comprising a processor element, a memory interface element, an IO interface element, a debug support element and an internal bus directly connected to all above elements, said microprocessor further comprising a registered boundary scan standard (JTAG) interface element directly connected to said internal bus, said JTAG interface element accessing one or more scan chains inside said microprocessor, and said JTAG interface element furthermore controlling DMA-type exchanges via said internal bus with other elements connected to said internal bus for debugging software running on said microprocessor.

2. A microprocessor as claimed in claim 1, wherein said JTAG interface element allows bidirectional downloading informations with respect to an external station.

3. A microprocessor as claimed in claim 1, wherein said debug support element is externally to said internal bus directly connected to said processor element.

4. A microprocessor as claimed in claim 1, wherein the JTAG interface element directly accesses one or more breakpoint registers.

5. A microprocessor as claimed in any of claims 1, wherein the JTAG interface element directly accesses a trace buffer external to the microprocessor.

6. A microprocessor as claimed in any of claim 1, wherein said debug support element contains an internal buffer memory for accommodating a restricted set of contents of non-sequential addresses as generated by the processing element and allowing at least one of the following storage modes for a limited time operation of said microprocessor: storing of all non-sequential addresses, and/or storing of all call, jump, and trap addresses, or any appropriate selection or part of these.

7. A microprocessor as claimed in claim 6, wherein said debug support element interfaces externally to the microprocessor via a serial clocked data path to an external event trace buffer memory for thereto outputting event signalization for storage.

8. A microprocessor as claimed in claim 7, wherein a special instruction (WR ASR31) is arranged for controlling loading of said external event trace buffer memory.

9. A microprocessor as claimed in claim 7, wherein the external trace buffer memory is arranged for together with recording any word therein also recording an actual time stamp indication.

10. A microprocessor as claimed in claim 7, wherein the external trace buffer memory is arranged for via a standard further interface outputting data to a standard workstation or personal computer.

* * * * *

UNITED STATES PATENT AND TRADEMARK OFFICE
CERTIFICATE OF CORRECTION

PATENT NO. : 5,590,354
DATED : December 31, 1996
INVENTOR(S) : Klapproth et al.

It is certified that error appears in the above-identified patent and that said Letters Patent is hereby corrected as shown below:

Claim 5, line 1 change "any of claims" to "claim".
Claim 6, line 1 delete "any of".

Signed and Sealed this

Seventeenth Day of March, 1998

Attest:

BRUCE LEHMAN

Attesting Officer

Commissioner of Patents and Trademarks